United States Patent [19]
Law et al.

[11] Patent Number: 5,930,790
[45] Date of Patent: Jul. 27, 1999

[54] STRING-MATCH ARRAY FOR SUBSTITUTIONAL COMPRESSION

[75] Inventors: Simon M. Law, Torrance; Daniel H. Greene, Sunnyvale; Li-Fung Cheung, Alhambra, all of Calif.

[73] Assignee: Xerox Corporation, Stamford, Conn.

[21] Appl. No.: 08/937,554

[22] Filed: Sep. 25, 1997

[51] Int. Cl.[6] .................................................. G06F 17/30
[52] U.S. Cl. ................................ 707/6; 707/101; 341/51; 341/67; 365/49; 365/231; 395/386
[58] Field of Search ......................... 341/51, 67; 365/49, 365/231; 395/386; 707/6, 101

[56] References Cited

U.S. PATENT DOCUMENTS

| | | | |
|---|---|---|---|
| 3,648,254 | 3/1972 | Beausoleil | 365/49 |
| 5,003,307 | 3/1991 | Whiting et al. | 341/51 |
| 5,179,378 | 1/1993 | Ranganathan et al. | 341/51 |
| 5,373,290 | 12/1994 | Lempel et al. | 341/51 |
| 5,467,319 | 11/1995 | Nusinov et al. | 365/231 |
| 5,499,382 | 3/1996 | Nusinov et al. | 395/386 |
| 5,532,693 | 7/1996 | Winters et al. | 341/51 |
| 5,828,593 | 10/1998 | Schultz et al. | 365/49 |

OTHER PUBLICATIONS

Bertin et al, Programmable Active Memories: A Performance Assessment, Mar. 1993, p. 6.
Ranganathan, High Speed VLSI Hardware for Lempel–Ziv Based Data Compression, not dated.

*Primary Examiner*—Paul R. Lintz
*Attorney, Agent, or Firm*—Robert Cunha

[57] ABSTRACT

A circuit for implementing a substitutional compressor. Comparators compare a current input pixel against a large number of previous pixels, the "history", stored in a series of shift registers. Each register and associated comparator constitutes a cell. If one or more matches are found the history data is shifted one pixel, the non-matching cells are disabled, and the next input pixel is compared against the contents of the same cells that had the previous matches. The matching is terminated when the longest series of matching pixels is found. The output code is then the length of the matching series of pixels, and the displacement of the first input pixel from the first matching pixel. An encoder generates an initialize signal that resets all of the disabled cells on the same clock cycle on which the output code word is generated. To make the circuit more compact, the cells can be arranged into a square format with one output line for each row and column from the cells to the encoder.

3 Claims, 3 Drawing Sheets

STRING-MATCH ARRAY FOR SUBSTITUTIONAL COMPRESSION

BACKGROUND OF THE INVENTION

A circuit implementation for a substitutional compressor which uses a history buffer for storing the previous pixels and comparators for comparing the current pixel to every previous pixel in the history buffer.

A substitutional compressor functions by replacing blocks of pixels with shorter references to earlier occurrences of identical blocks of pixels. For a numerical example, in the previous paragraph, the second occurrence of the words "history buffer" is repeated 126 spaces after the first occurrence in the word string (the "displacement"), and is a collection of 14 characters, counting the space between words, (the "length"). Thus, the second occurrence of "history buffer" can be replaced with the code word "126, 14".

The algorithm always looks for the longest possible match. Thus, after finding a match for "history buffe", it will look for "history buffer" which it will find, and then "history buffer." (with a period after it) which it will not find (the previous occurrence had a following space). Thus, "history buffer" will be the longest possible match.

The detailed algorithm can be found in a number of publications such as Edward R. Fiala and Daniel H. Greene, "Data Compression with Finite Windows" Communication of the ACM, April 1989, Volume 32, Number 4, 490-505. Many other references are also given by this paper.

A typical history buffer would be 4K pixels long and the longest permissible match can be as much as 256 pixels, at up to eight bits per pixel. The algorithm can be implemented in software, but hardware would be preferred because of its higher speed. Content Addressable Memories (CAM) could be used. For example, 8-bit pixels could be loaded into 4K CAMs, and the current pixel could be compared to each. The next cycle would be to replace the oldest pixel with the current pixel, and use a new pixel for the next comparison. However, it would be inefficient to develop CAM hardware to perform this function. Using CAM's would require massive storage space and involve operation steps that are difficult to pipeline or parallel in hardware. The resulting device would be large and complex and its operation speed would not meet the requirements of high performance products. A completely new approach needs to be taken to resolve this problem.

SUMMARY OF THE INVENTION

Instead of using a number of CAM's, this invention uses a number of cells in series, each cell having a register for storing one pixel, to implement the history buffer. Each previous pixel is loaded serially into the input end of the buffer, and all 4096 pixels are compared to the current pixel by the use of a comparator built into each cell. All cells that see a match continue to be enabled while any cell that sees a mismatch is disabled. If at least one match is seen, the current pixel is loaded into the history buffer, shifting all data to the right, and the next pixel is compared to all of the pixels contained in still-enabled cells in the history buffer. This process will continue until there is no match. In this case the last match will be the longest, and will be selected for coding. If there were two matches of equal length, the one with the shortest displacement is selected since the resultant code word for that one will be shorter. Then the cells are all reset, and the process starts again.

One remaining problem with this arrangement is the large number of output lines, 4096 in this example, that must be run to the reset circuit. This may take up too much space on the chip. To reduce the number of lines, the cells may be organized into a two dimensional block, 64 by 64. Now, with some additional logic to determine the location of the cell with the best match, only 128 lines will be required.

DETAILED DESCRIPTION OF THE INVENTION

Figure 1:
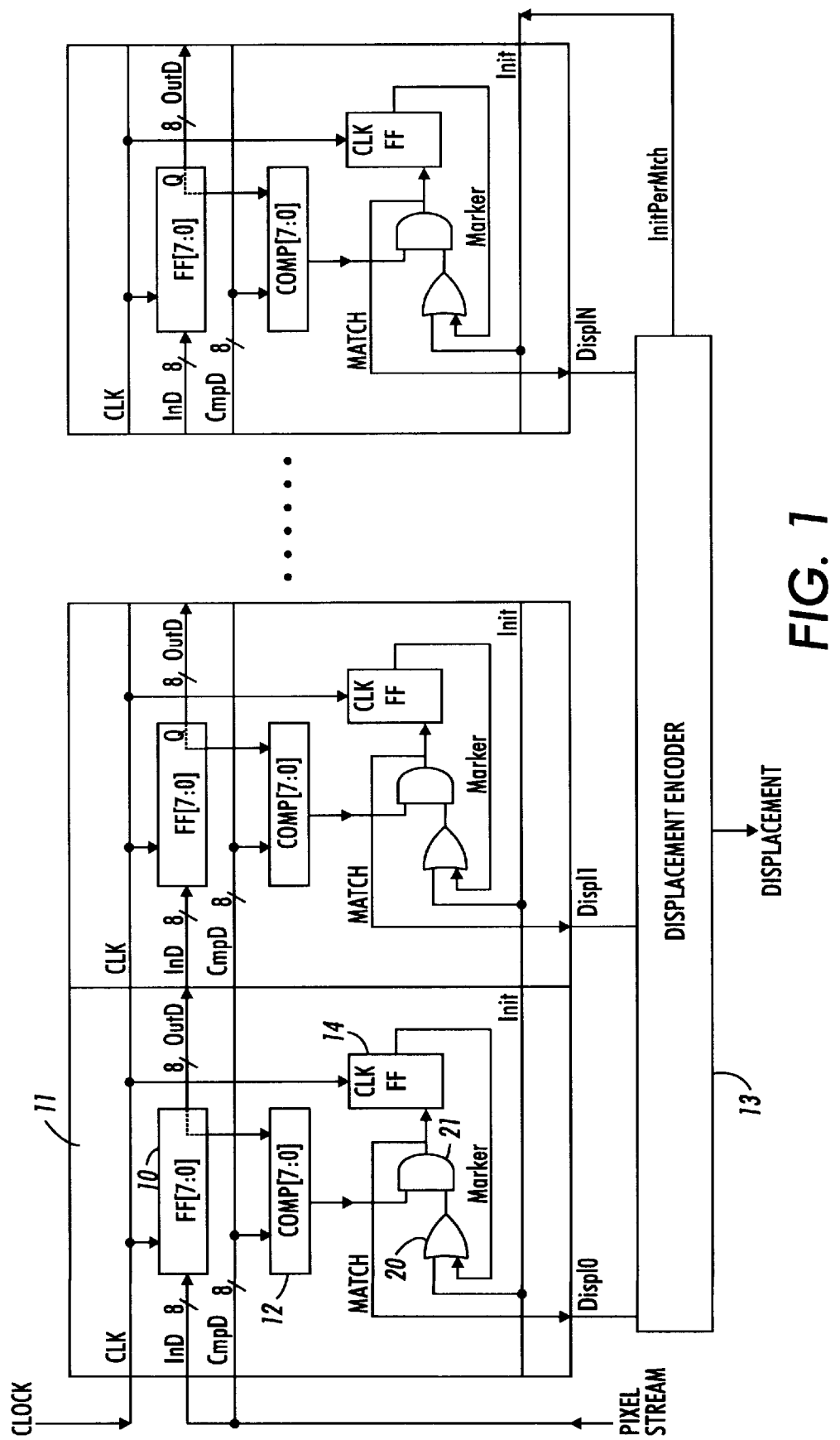
FIG. 1 is a circuit diagram of a one dimensional history buffer and simplified cell logic.

FIG. 1 shows a circuit for a one dimension string-match array. This diagram can be used to illustrate the basic concept of the proposed implementation. Register 10 in cell 11 is a storage element. When these cells are placed next to each other, these storage elements are connected together to form a right shift register.

The input pixel stream (under compression) is shifted into the array from the left (InD port). These input pixels move from one cell to the next at every rising edge of the clock. The pixels stored in the shift register represent the previous string (history) and are used to match with the incoming pixel stream. Before each pixel is shifted into the array, it is used (CmpD port) to compare with each individual pixel (history) in the array at comparator 12. The matched result of each cell is sent out to the displacement encoder 13 for encoding and also stored in the cell flipflop 14 as a match marker. This array can process one pixel per clock cycle. If a match occurred on the previous cycle, the marker signal is asserted. The current matched result is sent out and also stored in the flipflop as a marker at the next rising edge of the clock. If a mismatch occurs, the output is a miss and the marker is negated at the following rising edge of the clock. From now on, the marker stays negated, the output stays mismatched and the compared result is ignored. The current matching operation is completed when all the DisplX (X is 1 to N) output signals were negated. The displacement value for the longest match is encapsulated within the DisplX signals of the previous cycle. The following gives the operation steps of this string-match array.

At the beginning of a string-match operation, the first pixel is matched with every pixel stored in the shift-register. This activity starts right after the rising edge of the clock.

Also, at the beginning of a string-match operation, the InitPerMtch signal is asserted for one cycle. Effectively, this signal overrides the previous or initial marker value and enables the compared result from Comp[7:0] to be output and stored as a future marker directly.

The Displacement Encoder scans the input signals from Displ0 to DisplN for assertion. These signals are numbered from 0 (the leftmost) to N (the rightmost). The number that belongs to the signal that is found to be asserted first (in term of position) is latched as an output at the end of the clock cycle. This implies that the leftmost match is the most desirable one. This is because of the fact that it will give the smallest displacement value and as a result a shorter codeword is needed.

If the Displacement Encoder does find an assertion on the DisplX signals, the current matching operation will continue in the next clock cycle. In the next cycle, the InitPerMtch signal is not asserted. If the previous match of a cell is successful, the marker is asserted and the matched result from Comp[7:0] 12 is again outputted and stored as a future marker. A miss in the previous cycle indicates that the pixel in the previous (to the right) cell has broken the matching sequence with the incoming pixel string. Once it is broken, the matches for the following pixels become meaningless and it is maintained in a miss-state by the marker signal until a new string-match operation is needed.

If the Displacement Encoder 13 does not fmd an assertion on all the DisplX signals, the current string-match operation is completed. The displacement is given by the output of the displacement encoder on the previous cycle. The match length is given by the number of cycles that match did occur. A new string-match operation must be restarted within this current cycle. This can be done by asserting the InitPerMtch signal right after the displacement encoder has detected that there is no match on any of the DisplX signals.

A more detailed description of the operation of the logic for generating the match output signal is as follows. At the beginning of the next cycle after a mismatch ending a matched string, the Init signal is set to a 1, and is applied through OR gate 20 to one input of the AND gate 21. If the comparator shows a match on this cycle, another 1 is applied to the other input of AND gate 21. The resultant 1 output of gate 21 is sent out as the match signal, and the flip flop 22 is clocked on. Thereafter, as long as there is a match, the flipflop will stay on and continue to send out match signals. At the first mismatch, the 0 output of the comparator turns off the flipflop 22, and it will be disabled by its own output coupled through the OR gate 20 and AND gate 21 until the next Init signal is received.

The displacement encoder 13 contains several simple logic circuits. One is a coder which uses the 4096 Displn lines as an input to generate a 12-bit number representing the "displacement" part of the output. Another is a counter which counts and outputs the number of matches, the "length". Finally there is an OR circuit which detects when there is no match, for generating the Init signal.

The one dimension array shown in FIG. 1 provides an efficient scheme for transporting the pixel string and enables a high level of parallelism in performing the string-match. For example if there is 4096 cells, there will be 4096 possible strings to be searched for matching with the incoming string and all these searches are done at the same time. However in such a one dimension array with 4096 cells, the array must output 4096 DisplX signals. It will be a major problem to output that many lines from the array because these signal lines will use up a significant amount of space on the chip, and the Displacement Encoder will have a performance problem. When a big history buffer (large number of cells) is needed for a better compression ratio, a new implementation is needed.

Figure 2:
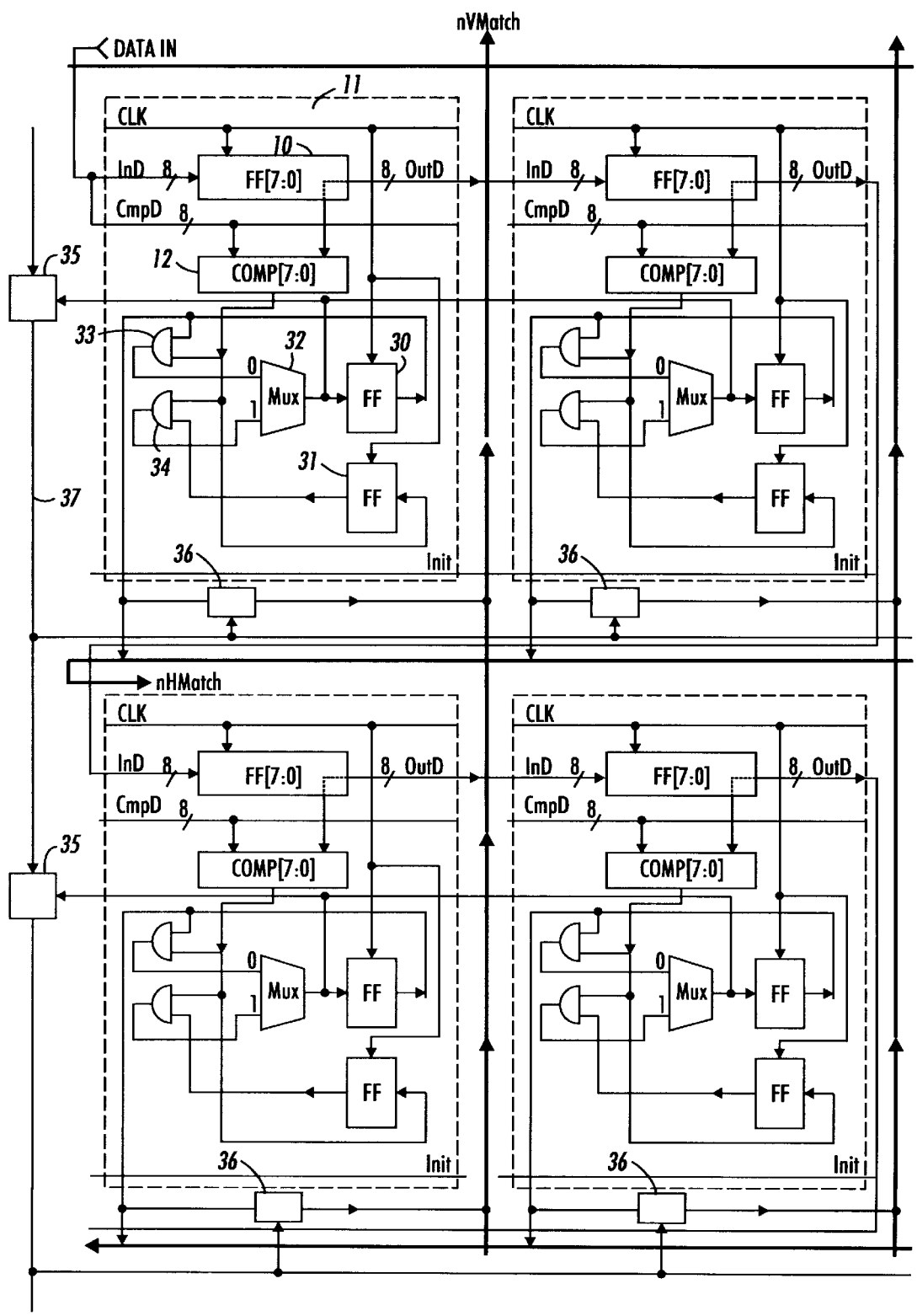
FIG. 2 is a circuit diagram of a two dimensional history buffer and improved cell logic for higher speed operation.

FIG. 2 shows a two dimension (2D) string-match array example. This 2D circuit resolves the problems exhibited by the one dimensional circuit. To make this example easier to read and understand, a 4×4 cell array is drawn. The actual implementation can be extended to 64×64 (4096 cells) or higher.

In this 2D circuit the cells 11 are repeated in both X and Y directions. The pixel stream is shifted into the upper left cell and output from the rightmost cell of the top row. This output feeds back into the leftmost cell of the second row and continues on to the rest of the cells. The DisplX signal is replaced by two match signals, the nVMtch and the nHMtch signal. Each of these signals is connected to the same signal of the other cells of the same row or of the same column to make a wired NOR gate. For achieving the shortest possible displacement codeword, the matches that occur in the upper row supersede the ones below it. The row will be disabled by another upper row, which has a match occur in any one of its cells. Also, as before, the shortest displacement is selected if there are two matches of the same length in the same row. In this way, only one cell can pull a nVMtch signal low. If there is no nHMtch signal asserted at all, the Match will be negated and the Init signal will be asserted and changes the current cycle to become the first cycle of another string-match operation. In this case the locations of the matches of this first cycle are not available outside but are stored in the cells for the next cycle. This does not present any problem because if the longest match is only one pixel, the raw data will be used anyway.

The displacement information for the longest match can be derived from the nHMtch and nVMtch signals. For a 64×64 array, the upper 6 bits of the displacement value can be encoded from the nHMtch signals and the lower 6 bits can be encoded from the nVMtch signals.

With this 2D circuit, the signal lines needed to be brought out from the array is reduced from N to two times the square root of N where N is the total number of cells. The displacement encoder is naturally broken into two stages. The physical layout on the silicon can now be done efficiently.

A problem with the cell logic of FIG. 1 is that after a string of matches, during the next clock period, not only must the mismatch be detected soon enough to start an Init signal so that all of the cells can be reset, but also, it must be started soon enough so that all of the cells have enough time to compare the next input pixel. In the case of the logic of FIG. 1, the path is so long that the circuit can not be used for high speed compression.

The longest delay path for the Match circuit of FIG. 1, when used in the two dimensionsl circuit of FIG. 2, is from the rising edge of clock through the shift-register 10, the comparator 12, the AND gate 21, the wired NOR of the nHMtch signal and the wired NOR gate of the nVMtch signal. If an extremely large array is needed, one can break this path into two pipeline stages. This can be done by feeding the outputs of the nHMtch signals to a set of registers (one for each signal). The output of these registers drives the HMtch lines, thereby breaking the horizontal match detection and the vertical match detection in two pipelines stages. The cells must include logic to pipeline the vertical match information.

Other than the nVMtch path, the second longest path for the 2D circuit is from the rising edge of the clock through the shift-register 10, the comparator 12, the AND gate 21, the wired NOR of the nHMtch signal, the logic to generate the Init signal and the input of the Marker 14 flipflop. This path is only somewhat shorter than the nVMtch path. This path can also be broken into 2 pipeline stages by using the cell shown FIG. 2. Since the VStrb is delayed by one cycle, in this new cell the Marker signal is used to drive the nVMtch signal. There are two horizontal match outputs. One (nHMtchO) delivers the same information as the nHMtch signal in the previous circuit. The other (nHMtchN) always delivers the match information of the second cycle of a new string-match operation. The Marker FF can either store the HMtchO or HMtchN information and this is selected by the Init signal.

FIG. 2 shows a 4×4 array example that uses this improved cell. Notice that the multiplexer 32 can select from either the AND 33 of the current comparison and the previous output, or the AND 34 of the current comparison and the previous comparison. This selection is determined by the match condition of the previous cycle. If the previous cycle produces a match in any cell, the previous output information is selected to be latched at the next rising edge of the clock. Otherwise the previous comparison information is selected. This leads to the fact that when a miss is detected, the Match signal is negated. This in turn asserts the Init signal and enables the Marker FF 30 in the cells to store the match information of a new (next) string-match operation. Also the nHMtchN, which carries the match information of the next string-match operation, is selected. This match information belongs to the second match cycle of the next string-match operation (not the first cycle). This is due to the fact that when a mismatch is detected on a cycle, one must immediately change this current cycle to the first cycle of a new string-match operation. However, by the time a mismatch is detected, it is too late to drive out any new information. Certainly, it is possible to add logic to do that but, as stated in the previous section, the match information of the first cycle has no value anyway. The performance of this circuit should be slightly less then two times faster than that of FIG. 1.

Figure 3:
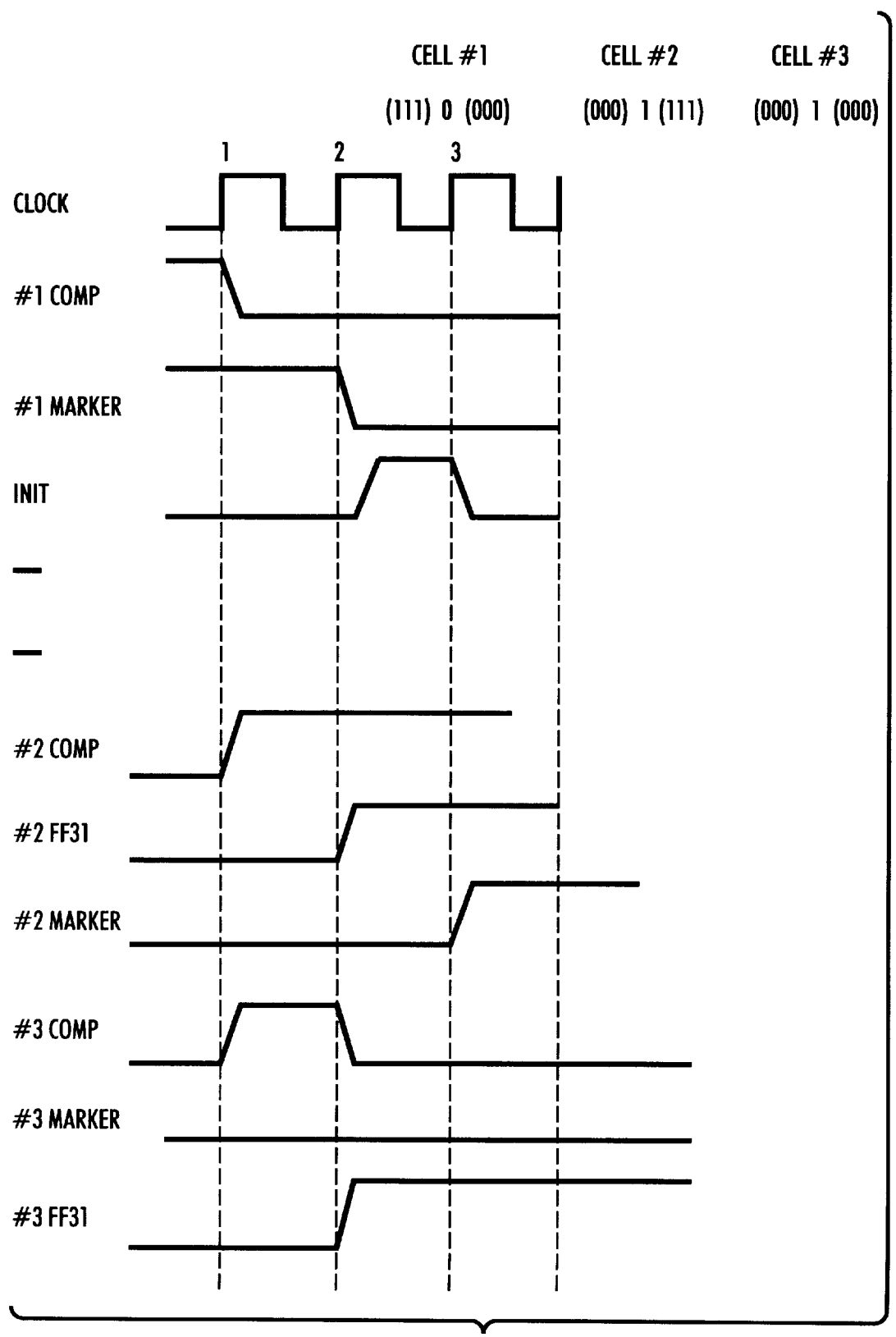
FIG. 3 is a timing diagram of the cell logic of FIG. 2.

This cell logic can be described with the use of the timing diagram of FIG. 3. Assume that T=1, the cell #1 comparison is a mismatch after a series of matches, that the cell #2 comparison is a match after a series of mismatches and that the cell #3 comparison is an isolated match within a series of mismatches. In this situation, the mismatch of cell #1 should end one length and reset all of the other cells, the match of cell #2 should start a new series of matches, and cell #3 should have no output since no attempt is made to compress an series with a length of 1.

At T=1 the #1 comparator goes negative, showing a mismatch, the init line is 0 so the multiplexer selects its upper input, and the comparator is 0 so the multiplexer 32 applies the 0 to the input of FF 30. When the FF 30 is clocked at T=2, the output Marker line goes low, causing the displacement encoder to generate an Init signal for one cycle.

In cell #2, at T=1 the comparator output goes 1. At T=2 the Init drives the multiplexer to select its lower input. The 1 is clocked through FF 31 and the comparator output is still a 1, so a 1 is applied to the FF30 input. That is clocked onto the output line at T=3.

Notice that the cell #2 output goes high one clock cycle after the cell #1 output went low. This is compensated for in the displacement encoder 13 by initializing the length counter to 1 instead of 0.

Finally, in Cell #3, the output is prevented from going high at T=3 because at T=2 Init is 1 which selects the lower mux input to apply it to FF30, and at T=2 the comparator is low so the mux must stay low. After a mismatch, the circuit will be enabled only if there are two matches in series At T=1 and T=2.

Throughout this discussion, the term "pixel" was used and 8 bit words were assumed. However, it is intended that this compression circuit and method is usable for digital data of any kind and words of any size. The only requirement is that the data is formed into a series of words of fixed length.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A circuit for compressing a string of words having one or more bits per word comprising:
   a first cell and a remaining number of cells, each comprising a means for storing a word, and a comparator, wherein all of said cells are coupled together so that all of the means for storing form a continuous register and are adapted to shift the words one word when a word is shifted into the means for storing of the first cell,
   each comparator coupled to the current word and the word stored in the means for storing in the same cell and adapted to compare the current word and the word stored in the means for storing, and to generate a match signal if there is a match, and to disable itself for detecting a match during the next clock cycle if there is no match, and
   an encoder coupled to every comparator and responsive to said match signals for generating an output code comprising the largest number of consecutive matches in a single cell and the displacement between the input and matching word, and
   wherein the cells are arranged into rows and columns, with an output line for each row and each column of cells for coupling all of the cells in each row and each column on an output line to the encoder, and wherein, after the detection of a non-match after two or more consecutive matches, if there are cells in more than one row with the same largest number of matches, the match generated by a cell in a previous row will be selected to output the code, and if there is more than one cell in a row with the same number of matches, the match generated by a previous cell will be selected to output the code.

2. The circuit of claim 1 wherein the encoder will output the code after the detection of a non-match in the cell that generated the longest number of matches on the previous clock, and initialize the circuit to compare the current word with the contents of every means for storing on the same clock cycle.

3. A circuit for compressing a string of words comprising:
   a first cell and a remaining number of cells, each cell comprising a means for storing a word and a comparator, wherein all of said cells are coupled together so that all of the means for storing form a continuous register and are adapted to shift the words one word when a current word is shifted into said first means for storing on each clock cycle,
   each comparator coupled to the current input pixel and the means for storing in the same cell, and adapted to compare the current pixel and the pixel stored in the means for storing on each clock cycle, and to generate a match signal when there is a match, and to disable itself when there is no match, and
   an encoder responsive to the first clock after the end of a continuous number of match signals for generating an output code comprising the largest number of consecutive matches in a single cell and the displacement of the cell that detected the matches or the lowest numbered cell that detected the matches if there were more than one, and for generating an initializing signal to enable all of the comparators that were disabled, and
   wherein the cells are arranged in rows and columns and wherein the encoder is coupled to all of the cells in each row by one line and all of the cells in each column by one line.

* * * * *